United States Patent
Xie et al.

(10) Patent No.: US 12,045,512 B2
(45) Date of Patent: *Jul. 23, 2024

(54) READ REFRESH VIA SIGNAL CALIBRATION FOR NON-VOLATILE MEMORIES

(71) Applicant: Micron Technology, Inc., Boise, ID (US)

(72) Inventors: Tingjun Xie, Milpitas, CA (US); Zhenming Zhou, San Jose, CA (US); Zhenlei Shen, Milpitas, CA (US); Chih-Kuo Kao, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/086,580

(22) Filed: Dec. 21, 2022

(65) Prior Publication Data
US 2023/0120838 A1    Apr. 20, 2023

Related U.S. Application Data

(63) Continuation of application No. 16/552,692, filed on Aug. 27, 2019, now Pat. No. 11,561,726.

(51) Int. Cl.
*G06F 3/06* (2006.01)
*G11C 7/10* (2006.01)

(52) U.S. Cl.
CPC .......... *G06F 3/0659* (2013.01); *G06F 3/0604* (2013.01); *G06F 3/0679* (2013.01); *G11C 7/1066* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 8,565,033 B1* | 10/2013 | Manohararajah | G11C 5/04 365/233.17 |
| 9,401,189 B1* | 7/2016 | Ding | G11C 29/023 |
| 10,475,492 B1 | 11/2019 | Yang | |
| 2011/0235459 A1 | 9/2011 | Ware | |
| 2011/0283060 A1 | 11/2011 | Ware | |
| 2012/0250433 A1 | 10/2012 | Jeon | |
| 2015/0127998 A1* | 5/2015 | Veggetti | G11C 29/52 711/167 |
| 2018/0032122 A1 | 2/2018 | Agrawal | |
| 2018/0136843 A1 | 5/2018 | Lee | |

* cited by examiner

*Primary Examiner* — Sanjiv Shah
*Assistant Examiner* — Alexander J Yoon
(74) *Attorney, Agent, or Firm* — Lowenstein Sandler LLP

(57) ABSTRACT

A processing device in a memory sub-system initiates read operations on each of a plurality of segments in a first region of the memory device during a first time interval, wherein at least a subset of the plurality of segments in the first region of the memory device are storing host data. The processing device further receives, as a result of at least one read operation, at least one data signal from a corresponding one of the plurality of segments in the first region of the memory device, and performs a signal calibration operation using the at least one data signal to synchronize one or more relevant signals with a reference clock signal used by the processing device.

20 Claims, 6 Drawing Sheets

READ REFRESH VIA SIGNAL CALIBRATION FOR NON-VOLATILE MEMORIES

RELATED APPLICATIONS

This application is a continuation of U.S. patent application Ser. No. 16/552,692, filed Aug. 27, 2019, the entire contents of which are hereby incorporated by reference herein.

TECHNICAL FIELD

Embodiments of the disclosure relate generally to memory sub-systems, and more specifically, relate to read refresh via signal calibration for non-volatile memories.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
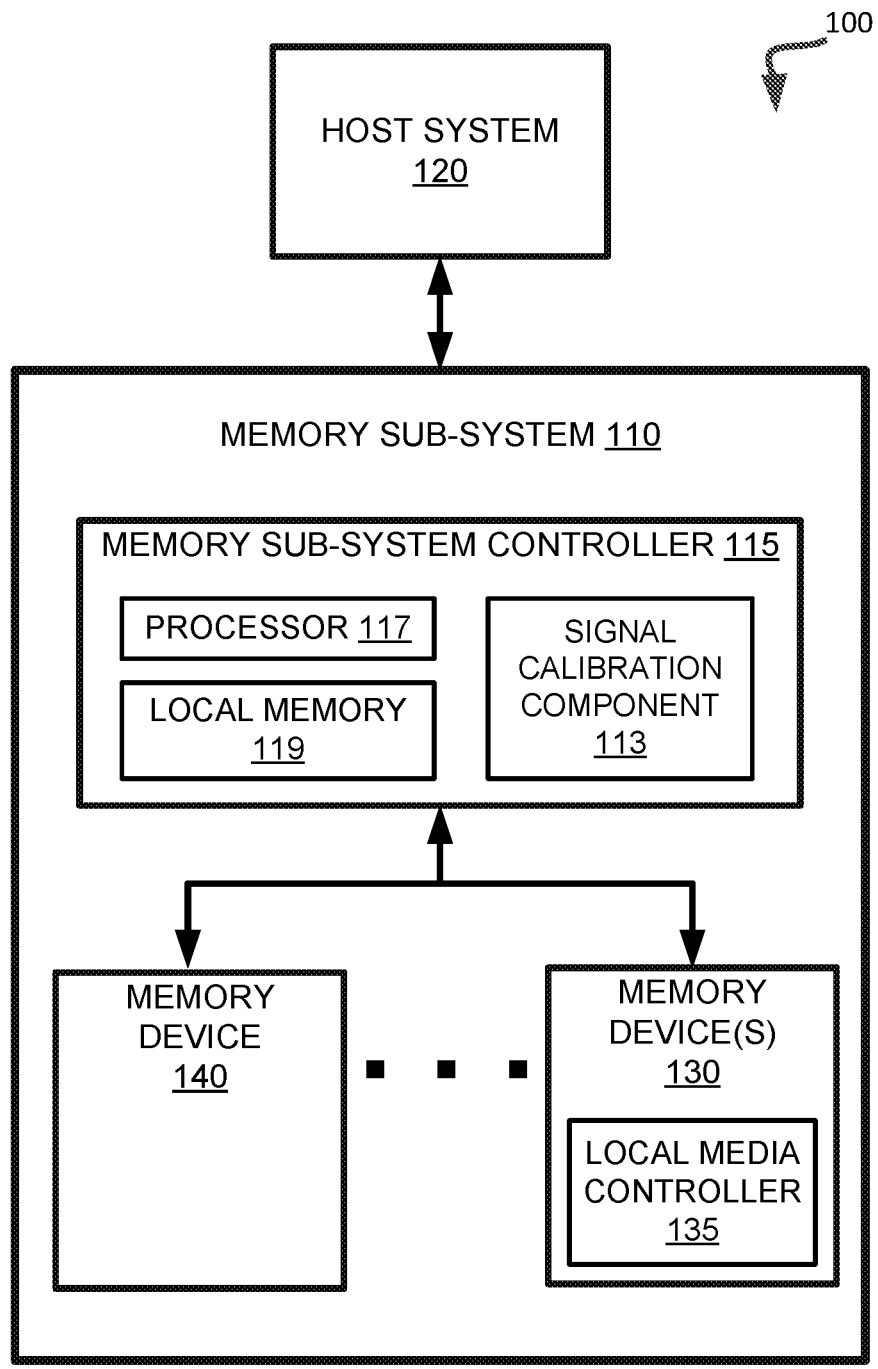
FIG. 1 illustrates an example computing environment that includes a memory sub-system in accordance with some embodiments of the present disclosure.

Aspects of the present disclosure are directed to read refresh via signal calibration for non-volatile memories in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

A memory sub-system can include multiple memory devices that can store data from a host system. The memory devices can be non-volatile memory devices, such as three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1. The memory sub-system includes a memory sub-system controller that can communicate with the memory devices to perform operations such as reading data, writing data, or erasing data at the memory devices and other such operations. A memory sub-system controller is described in greater below in conjunction with FIG. 1.

The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. The metadata and host data, together, is hereinafter referred to as "payload". Metadata, host data, and parity data, which is used for error correction, can collectively form an error correction code (ECC) codeword. Metadata can also include data version (e.g. used to distinguish age of data written), valid bitmap (which LBAs or logical transfer units contain valid data), etc.

Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values. For example, a single level cell (SLC) can store one bit of information and has two logic states.

The memory sub-system can initiate media management operations that can include executing, for example, a write operation or read operation, a refresh or folding operation, or other operation, on host data that is stored on a memory device. For example, the memory sub-system may re-write previously written host data from a location on a memory device to the same location or a new location as part of a write refresh operation. In another example, the media management operations can include a re-read of host data that is stored on a memory device as part of a read refresh operation. "User data" hereinafter generally refers to host data and data that is re-written as part of media management. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

The storing of data at a memory device can increase the wear of the memory device. After a threshold amount of write operations, the wear can cause the memory device to become unreliable so that data can no longer be reliably stored and retrieved from the memory device. As the number of write operations and/or erase operations performed on a memory cell increases, the probability of the data stored at the memory cell including an error also increases, due to the growing level of damage of the memory cell. Additional read and write operations can also result in a higher error rate of the data stored at the memory cells. This can increase the use of error recovery operations, which includes but is not limited to read retry (i.e. sensing the memory component again) and RAID (redundant array of independent disks) for subsequent data operations (e.g., read and/or write) performed on the memory cell. The increased use of the error recovery operations can result in a reduction of the performance of a conventional memory sub-system. In addition, as the error rate continues to increase, it may even surpass the error recovery capabilities of the memory sub-system, leading to an irreparable loss of the data. Furthermore, as more resources of the memory sub-system are used to perform the error recovery operations, fewer resources are available to perform other read operations or write operations.

For certain memory types (i.e., for memory sub-systems employing certain types of storage media), the error rate can vary over time. In particular, some non-volatile memories have threshold voltage (Vt) distributions that move as a function of time (hereinafter referred to as 'intrinsic movement'). At a given read level (i.e., the voltage applied to a memory cell as part of a read operation), if the Vt distributions move, then certain reliability statistics can also be affected. One example of a reliability statistic is a raw bit error rate (RBER). The RBER can be defined as the ratio of the number of erroneous bits to the number of all data bits stored in a unit of the memory sub-system, where the unit can be the entire memory sub-system, a die of a memory component, a collection of codewords, or any other meaningful portion of the memory sub-system. Since the Vt distributions can be constantly affected by intrinsic movement, disturbances of self or neighboring cells, circuitry noise, temperature, etc., various refresh operations can be performed to restore the Vt distributions to a desired state. A write refresh operation, for example, includes rewriting the data of a memory cell, to either the same or a different physical memory location, in order to give the cell a clean slate free from serious intrinsic movement of Vt distributions, disturb effects and noises. The cell can be rewritten once or multiple times according to its current state (i.e., logical '0's' rewritten as logical '0's' and logical '1's' rewritten as logical '1's') or rewritten some even number of times with alternating states (i.e., the logical states reversed on a first rewrite and restored on a second rewrite). Write refresh operations are expensive in terms of sub-system performance and memory component endurance, however, so in conventional memory sub-systems, a read refresh operation may be preferred in certain circumstances. A read refresh operation involves reading the content of a memory cell to take advantage of a partial write effect that occurs with the read operation. For certain types of memory components, a read operation can change the Vt distributions of the memory cells, which is also known as a partial write effect. For example, in a read operation, any cell voltage lower than and/or proximate to the applied read voltage can be physically pushed further away from the point of the read voltage. The result of read refresh performed at an optimal read voltage is the restoration of and additional separation between the Vt distributions, a larger read window budget (RWB) and improved RBER and robustness to noises.

In addition, many high speed electronic systems, including memory sub-systems, operate with critical timing requirements that dictate a need to use a periodic clock waveform possessing a precise timing relationship with respect to some reference signal. The accuracy of signals transmitted between components, such as between a memory sub-system controller and a memory device, relies on a synchronization between the corresponding signals of each component. While certain signals should be perfectly aligned (e.g., with zero offset such that signal transitions occur at the same time), other signals can have a specific non-zero offset, such that signal transitions occur after a known amount of time delay. Even for integrated circuits implemented on the same board or package, various factors can cause the timing signals of the different components to drift and/or fluctuate over time. For example, different manufacturing parameters, processing variations, ambient temperatures, applied voltages, clock jitter, noises and disturbs can all lead to large differences in the phases of the respective signals. Accordingly, memory sub-systems can continuously perform signal calibration operations during times when the memory devices included therein are powered-on. These signal calibration operations detect whether the corresponding clock signals or other signals of the memory sub-system controller and memory devices remain synchronized to ensure the integrity of data transmitted between the two components. For example, the memory sub-system controller can periodically collect output data read from a memory device and perform a signal processing routine to internally optimize signal offsets. This period can be as short as one or a few microseconds, which leads to a significant number of signal calibration read operations being performed over time.

Aspects of the present disclosure address the above and other deficiencies by performing read refresh via signal calibration for non-volatile memories. In one implementation, a memory sub-system controller allocates a dual-purpose region of one or more memory devices in the memory sub-system for both servicing host-initiated memory operations and performing signal calibration operations. Accordingly, the memory segments of this region can store host data and can be read by the memory sub-system controller for signal calibration. In one implementation, the memory sub-system controller systematically initiates read operations on each of the segments in the region during a first time interval. The memory sub-system controller receives, as a result of each read operation, a data signal from a corresponding one of the segments in the region and performs a signal calibration operation using the data signal to synchronize relevant signals with a reference clock signal used by the memory sub-system controller. Depending on the embodiment, the memory sub-system can include any number of relevant signals having corresponding synchronization requirements that can be optimized (for synchronization purposes) based on the received data signal. These relevant signals may include, for example, a data signal (DQ), a data strobe signal (DQS), a data mask signal (DM), a command/address signal (CA), or some other signal. The memory sub-system controller can read each segment sequentially or in some other systematic manner to ensure that each segment in the region of the memory device will be read for purposes of signal calibration at least once during the first time interval. In another embodiment, the signal calibration operation is based on a batch of reads (e.g., a set number of the most recent read operations) rather than on a single signal from one read operation. For example, the memory sub-system controller can receive a number of data signals from the set number of read operations, each corresponding to a different segment, and can combine them together and perform signal calibration based on the combination.

Advantages of the present disclosure include, but are not limited to improved performance in the memory sub-system. By reading each segment in the designated region, where at least a portion of these segments are storing host data, the memory sub-system controller performs adequate signal calibration read operations to ensure that the relevant clock signals used by the memory device and the memory sub-system controller remain synchronized. In addition, the capacity of the memory device that is available to store host data is increased, as a portion of the memory device need not be reserved solely for signal calibration read operations, and such a dedicated region is not damaged by the repetitive read operations. Furthermore, the systematic signal calibration reads performed during the first time interval provide the added benefit of read refresh on the segments in the region of the memory device. Accordingly, the memory sub-system controller can reduce or even eliminate the number and frequency of managerial read refresh operations performed on the region of the memory device. This allows system resources to be made available for operation operations, including servicing host memory access operations, thereby improving performance and reducing latency.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A 3D cross-point memory device is a cross-point array of non-volatile memory cells that can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased.

Although non-volatile memory components such as 3D cross-point type and NAND type memory are described, the memory device 130 can be based on any other type of non-volatile memory, such as read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, a particular memory component can include an SLC portion, and an MLC portion, a TLC portion, or a QLC portion of memory cells. The memory cells of the memory devices 130 can be grouped as pages or codewords that can refer to a unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. In some embodiments, the memory device 130 is a managed memory device, which is a raw memory device combined with a local controller (e.g., local controller 135) for media management within the same memory device package. An example of a managed memory device is a managed NAND (MNAND) device.

The memory sub-system 110 includes signal calibration component 113. In one implementation, signal calibration component 113 can perform signal calibration operations during times when the memory devices 130 are powered-on. These signal calibration operations detect whether the corresponding clock signals of the memory sub-system controller 115 and memory devices 130 remain synchronized to ensure the integrity of data transmitted between the two components. In one implementation, for example, signal calibration component 113 can periodically collect output data read from a memory device 130 and perform a signal-processing routine to internally optimize signal offsets. In one implementation, signal calibration component 113 systematically initiates read operations on each of the segments in a given region of memory device 130 during a first time interval. Signal calibration component 113 receives, as a result of each read operation or batch of read operations, one or more data signals from a corresponding one or more of the segments in the region and performs a signal calibration operation using the data signal(s) to synchronize relevant signals (e.g., DQ, DQS, DM, CA) with a reference clock signal used by the memory sub-system controller 115. Signal calibration component 113 can read each segment sequentially or in some other systematic manner to ensure that each segment in the region of the memory device will be read for purposes of signal calibration at least once during the first time interval.

Signal calibration component 113 performs these signal calibration read operations on segments of memory device 130 storing host data in contrast to conventional systems. These conventional systems often include a fixed redundant area of the memory device that is read repeatedly for signal calibration through the entire life of the memory device. This fixed redundant area is transparent to the media management operations of memory sub-system controller 115 and is treated as nonexistent. Accordingly, this area reduces the space on the memory device available for storing host data. In addition, since signal calibration read operations can be performed at a very high rate, the number of read operations performed on this dedicated area can be very high, leading to physical damage of the segments in that area and earlier failure of the memory device. Other conventional systems perform read operations of a register on memory device 130 for purposes of signal calibration. Certain memory devices have strict constraints on when the memory sub-system controller can perform a register read operation, which may prevent the register reads from being performed often enough to satisfy the requirements of signal calibration. Furthermore, neither conventional technique takes advantage of the read refresh characteristics of the segments of the memory device storing host data, thereby requiring the memory sub-system controller to separately issue a sufficient number of managerial read refresh operations on the segments of the memory device.

When a dual-purpose region of the memory device 130 (i.e., a region including segments that both store host data and can be read by signal calibration component 113 for performing signal calibration operations) is identified, however, the above identified disadvantages are eliminated. In one embodiment, when signal calibration component 113 spreads the signal calibration read operations across an entire region of memory device 130 (i.e., where this region may include all or substantially all of the available segments on the memory device 130), both signal calibration and read refresh targets can be achieved at the same time. Further details with regards to the operations of signal calibration component 113 are described below.

Figure 2:
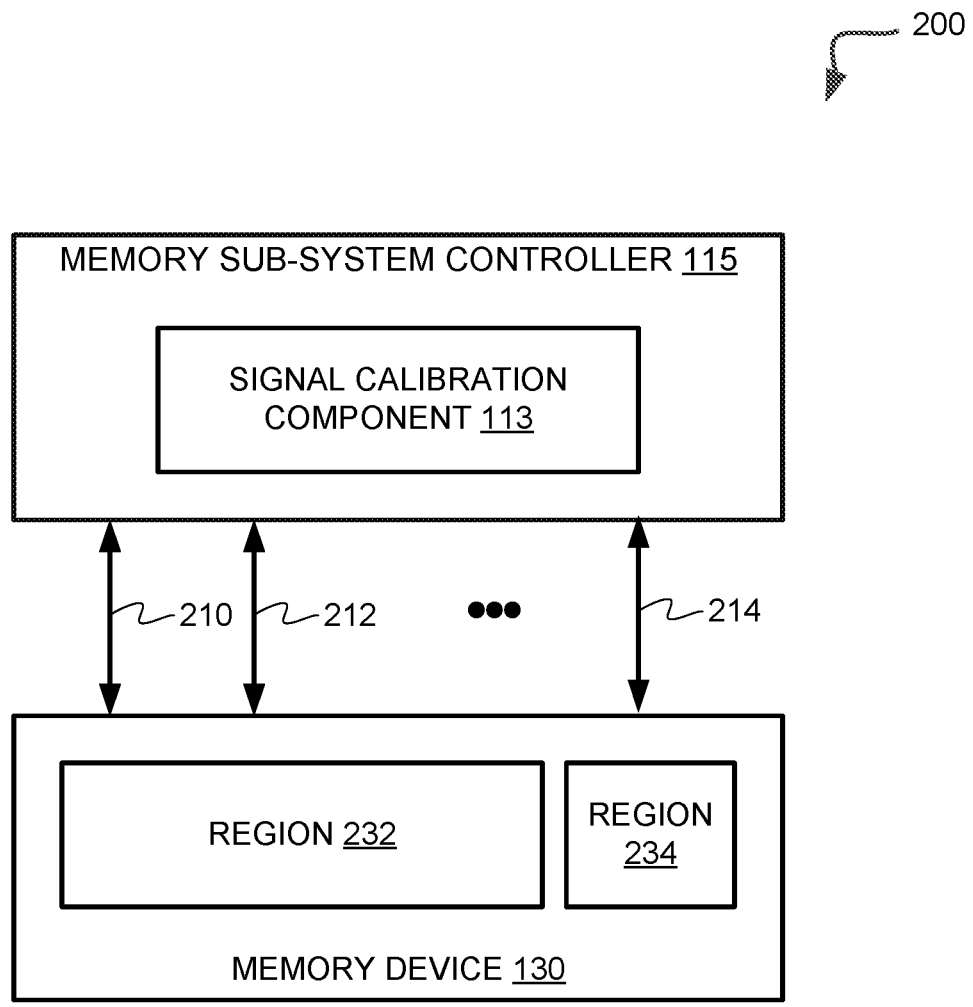
FIG. 2 is a block diagram illustrating operation of a memory sub-system controller performing read refresh via signal calibration for a memory device in accordance with some embodiments of the present disclosure.

FIG. 2 is a block diagram illustrating operation 200 of a memory sub-system controller 115 performing read refresh via signal calibration for a memory device 130 in accordance with some embodiments of the present disclosure. In one embodiment, memory sub-system controller 115 is operatively coupled with memory device 130 via one or more electrical connections (e.g., one or more buses). Depending on the embodiment, the one or more buses may include a number of separate communication channels 210, 212, 214. Each of the separate communication channels 210, 212, 214 can separately transmit data and/or command signals between memory sub-system controller 115 and corresponding portions of memory device 130. Memory sub-system controller 115 can transmit and receive these signals using one or more internal clock signals (also referred to herein as a "reference clock signal" or "reference clock signals"). In one embodiment, memory sub-system controller 115 can transmit and receive the signals on each of communication channels 210, 212, 214 using a single common reference clock signal. In another embodiment, memory sub-system controller 115 can transmit and receive the signals using a separate reference clock signal for each of communication channels 210, 212, 214.

In one embodiment, signal calibration component 113 can identify one or more regions in memory device 130, such as region 232 and region 234. The regions in memory device 130 can be either physical or logical separations, and each region can include any number of memory segments. Depending on the underlying media type used for memory device 130, each region can be defined, for example, as one or more elementary units (e.g., pages), one or more managed units (e.g., a group of pages or ECC codewords), or any other applicable slice or partition of the memory device 130. Depending on the embodiment, the size and arrangement of region 232 and region 234 can be flexible and can change during the operational lifetime of the memory device 130. For example, either or both of region 232 and region 234 can include one or more of a mapped area, an unmapped area, a reserved area, and/or a retired area. The mapped area can include one or more segments currently storing host data (i.e., data stored on behalf of host system 120). Segments from a mapped area can become unmapped over time, such as if data stored at a mapped segment is moved to a different segment as part of a wear leveling operation. The unmapped area can include one or more segments not currently storing host data but eligible to store host data. Segments from an unmapped area can become mapped over time, such as if data stored at a unmapped segment is moved to the mapped segment as part of a wear leveling operation. The reserved area can include one or more segments available to replace defective segments on the memory device 130 and the retired area can include one or more defective segments that previously stored host data.

In one implementation, signal calibration component 113 can perform signal calibration operations during times when memory device 130 are powered-on. To do so, signal calibration component 113 can identify a certain region, such as region 232, of the memory device 130, and initiate read operations of each of the individual segments in the region 232. As described above, region 232 can include a portion of memory device 130 or can include all of the segments of memory device 130. Regardless of the size or arrangement, region 232 can include at least some segments that store or are available to store host data on behalf of host system 120. For example, at least some of the segments in region 232 can store data written to the memory sub-system 110 by host system 120 or data to be read from the memory sub-system by host system 120.

In one embodiment, each of communication channels 210, 212, 214 is used to send and receive signals from multiple memory die of memory device 130. In one embodiment, region 232 can include multiple memory dies, and can be accessed using multiple of communication channels 210, 212, 214. Depending on the reference clock signals involved, signal calibration component 113 can perform a single signal calibration for all of communication channels 210, 212, 214, a single signal calibration for a subset of the communication channels, or a separate signal calibration for each of the communication channels. In one embodiment, signal calibration component 113 can periodically collect output data read from certain segments of region 232 of memory device 130 and received over one or more of communication channels 210, 212, 214. Signal calibration component 113 can perform a signal calibration operation using the data signals from each segment of region 232 to synchronize relevant signals with a reference clock signal used by memory sub-system controller 115. In one embodiment, the signal calibration operation includes a signal-processing routine to internally optimize signal offsets to ensure that the signals are sufficiently aligned. Signal calibration component 113 can periodically repeat this process for each segment in region 232 to ensure that the synchronization of the clock signals is verified at a regular interval and to ensure that each segment of region 232 is read within a certain time interval to take advantage of the read refresh properties of the underlying storage media. Accordingly, signal calibration component 113 can schedule managerial read refresh operations on the segments of region 232 at a frequency that is reduced, or even eliminated, compared to an embodiment where signal calibration reads are not directed to region 232 of memory device 130.

Figure 3:
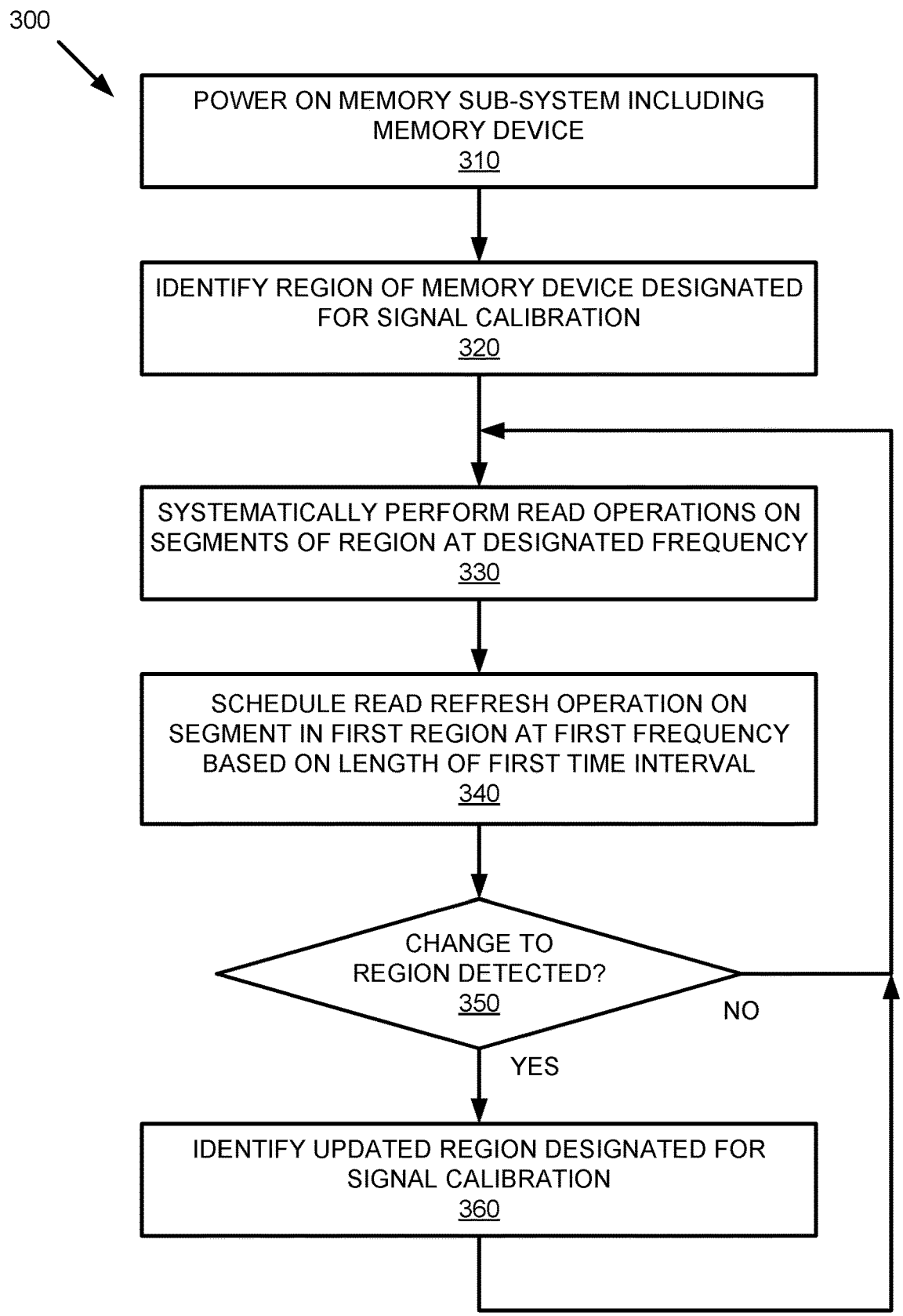
FIG. 3 is a flow diagram of an example method of read refresh via signal calibration for a non-volatile memory device in accordance with some embodiments of the present disclosure.

FIG. 3 is a flow diagram of an example method of read refresh via signal calibration for a non-volatile memory device in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by signal calibration component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic powers on (or detects a powering on of) a memory sub-system 110 including one or more memory devices, such as memory device 130. At operation 320, the processing logic identifies a region, such as region 232, of memory device 130 that is designated for signal calibration. In one embodiment, the region 232 can be some physical or logical partition of memory device 130. Region 232 can include, for example, one or more of a mapped area, an unmapped area, a reserved area, and/or a retired area. In one embodiment, at least a subset of the segments in region 232 are storing host data from host system 120. This subset can include, for example, a portion of region 232 or all of region 232. Depending on the embodiment, region 232 can include all of the segments of memory device 130, or a portion of the segments of memory device 130.

At operation 330, the processing logic systematically performs signal calibration read operations on segments of region 232 at a designated rate during a first time interval. As will be described in more detail with respect to FIG. 4, signal calibration component 113 can periodically collect output data read from each segment of region 232 and perform signal calibration operation using each data signal or a recent collection of data signals read from region 232 to internally optimize signal offsets. Signal calibration component 113 can read each segment of region 232 sequentially or in some other systematic manner to ensure that each segment in region 232 of the memory device will be read for purposes of signal calibration at least once during the first time interval. The first time interval can be set according to how often each segment in region 232 should be read in order to take advantage of the read refresh capabilities and ensure consistent operation of the memory device 130.

At operation 340, the processing logic optionally schedules a read refresh operation on the segments of region 232 storing host data at a first frequency. In one embodiment, the first frequency is based on a length of the first time interval. Signal calibration component 113 can schedule managerial read refresh operations on the segments of region 232 at a frequency that is reduced, or even eliminated, compared to an embodiment where signal calibration reads are not directed to region 232 of memory device 130. For example, if the physical characteristics of memory device 130 dictate that a read refresh operation be performed every so often, that frequency can be reduced to the first frequency in view of how often signal calibration component 113 performs a signal calibration read (which provides the same benefit as a managerial read refresh operation) on each segment of region 232.

At operation 350, the processing logic determines whether a change to region 232 is detected. Over the operational life of memory device 130, numerous factors can impact region 232. For example, the size of region 232 can increase or decrease, such as if a retired area or reserved area is used for performing signal calibration reads. As segments are either added to the retired area or removed from the reserved area, the size of region 232 can change. In addition, although the actual size of region 232 may not change, the actual coverage of region 232 may change, such as if a mapped area or unmapped area is used for performing signal calibration reads. Furthermore, both the size and actual coverage of region 232 may change. If no change to region 232 is detected, the processing logic returns to operation 330 and continues to systematically perform read operation on segments of region 232.

If a change to region 232 is detected, at operation 360, the processing logic identifies an updated region that is designated for signal calibration and returns to operation 330 and systematically performs read operation on segments of the updated region. For example, the updated region can include region 234, a portion of region 232 and all of region 234, a portion of region 232 and a portion of region 234, all of region 232 and all of region 234, all of region 232 and a portion of region 234, or any other combination.

Figure 4:
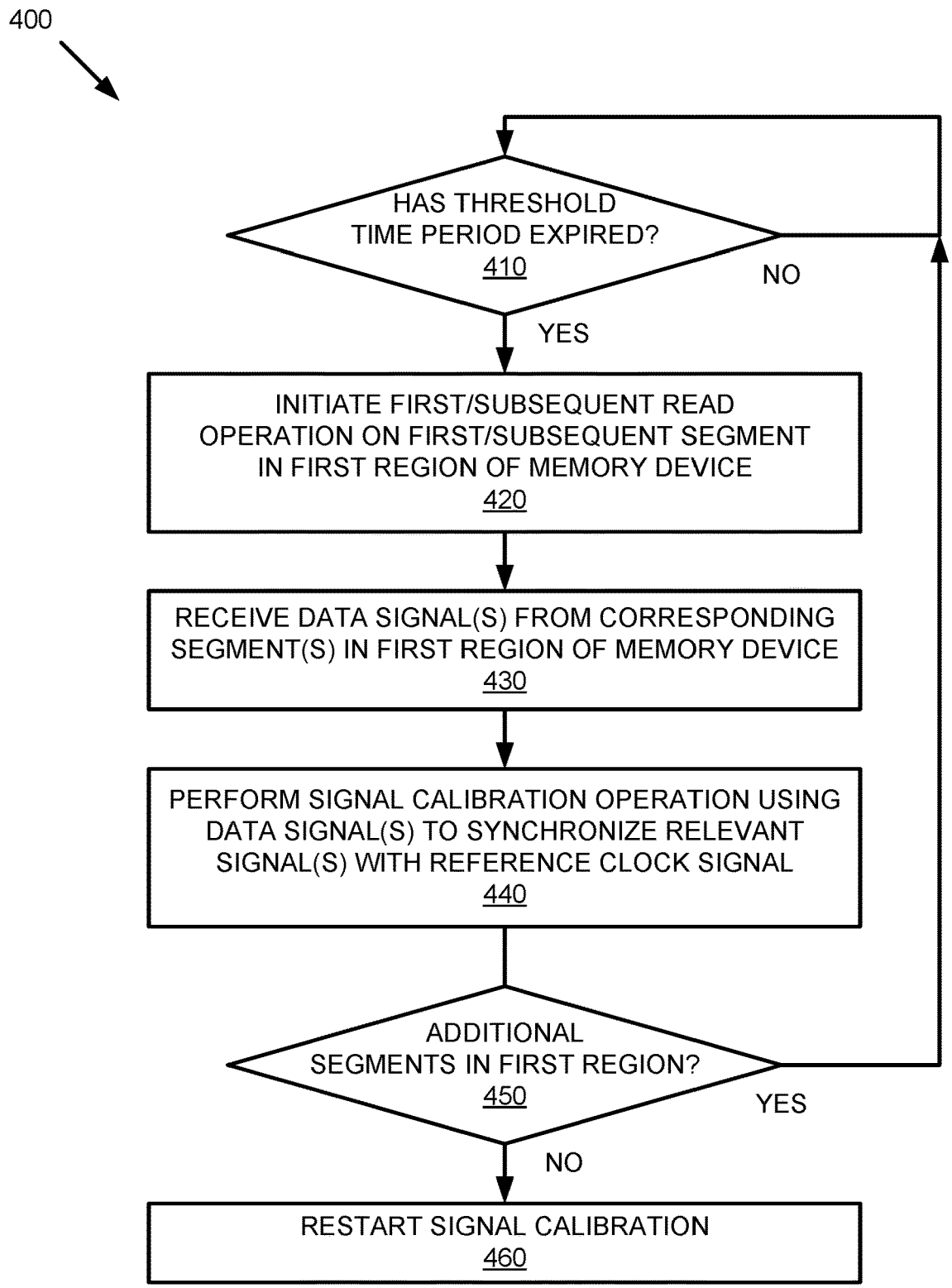
FIG. 4 is a flow diagram of an example method of read refresh via signal calibration for a non-volatile memory device in accordance with some embodiments of the present disclosure.

FIG. 4 is a flow diagram of an example method of read refresh via signal calibration for a non-volatile memory device in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by signal calibration component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic determines whether a threshold time period has expired. In one embodiment, the threshold time period is based on system requirements for signal calibration (i.e., how often signal calibration needs to be performed in order to ensure accurate operation of the memory sub-system). Thus, for a given number of segments in region 232 of the memory device 130, a first time interval represents a period of time in which all of the segments of region 232 of memory device 130 can be read using a signal calibration read operation, where each read is separated by the threshold time period. Thus, given the particular signal calibration requirement, the threshold time period represents how often a segment in region 232 must be read in order to ensure that the signal calibration can be successfully executed.

If the threshold time period has expired, at operation 420, the processing logic initiates a read operation on a segment in region 232 of the memory device 130. In one embodiment, to initiate the read operation, signal calibration component 113 identifies a current/next segment to be read according to an algorithm being used (see FIG. 5) and applies a corresponding read voltage signal to the identified segment. At operation 430, the processing logic receives, as a result of the read operation, a data signal from the corresponding segment in region 232 of the memory device 130. In one embodiment, signal calibration component 113 receives the data signal or data signals, which can include a voltage waveform or waveforms representative of a value or values stored in the corresponding memory segment.

At operation 440, the processing logic performs a signal calibration operation using the data signal (or a batch of data signals) to synchronize relevant signals with a reference clock signal used by memory sub-system controller 115. In one embodiment, signal calibration component 113 compares the data signal or signals read from a segment or segments of region 232 with a reference clock signal. Signal calibration component 113 can use a signal processing routine to optimize the offsets of the relevant signals (e.g., DQ, DQS, DM, CA). For example, in one embodiment, signal calibration component 113 can compare the offsets between transitions of each signal to ensure that the offsets are within an allowable deviation from an expected value. Depending on the embodiment, the expected offset can be zero or some other non-zero value. In one embodiment, signal calibration component 113 compares the received data signal(s) to a separate clock signal used by memory sub-system controller 115 to determine an offset and optimizes the offsets of the relevant signals according to that determined offset. In another embodiment, signal calibration component 113 compares the relevant signals directly to the received data signal(s) to determine the signal transition offsets. In other embodiments, some other signal processing routine can be used.

At operation 450, the processing logic determines whether additional segments are present in the first region 450. If there are additional segments in the first region 232, the processing logic returns to operation 410 and performs operations 420-440 for each remaining segment in the first region 232. If there are no additional segments in the first region 232, at operation 460, the processing logic restarts signal calibration of the first region 232.

Figure 5:
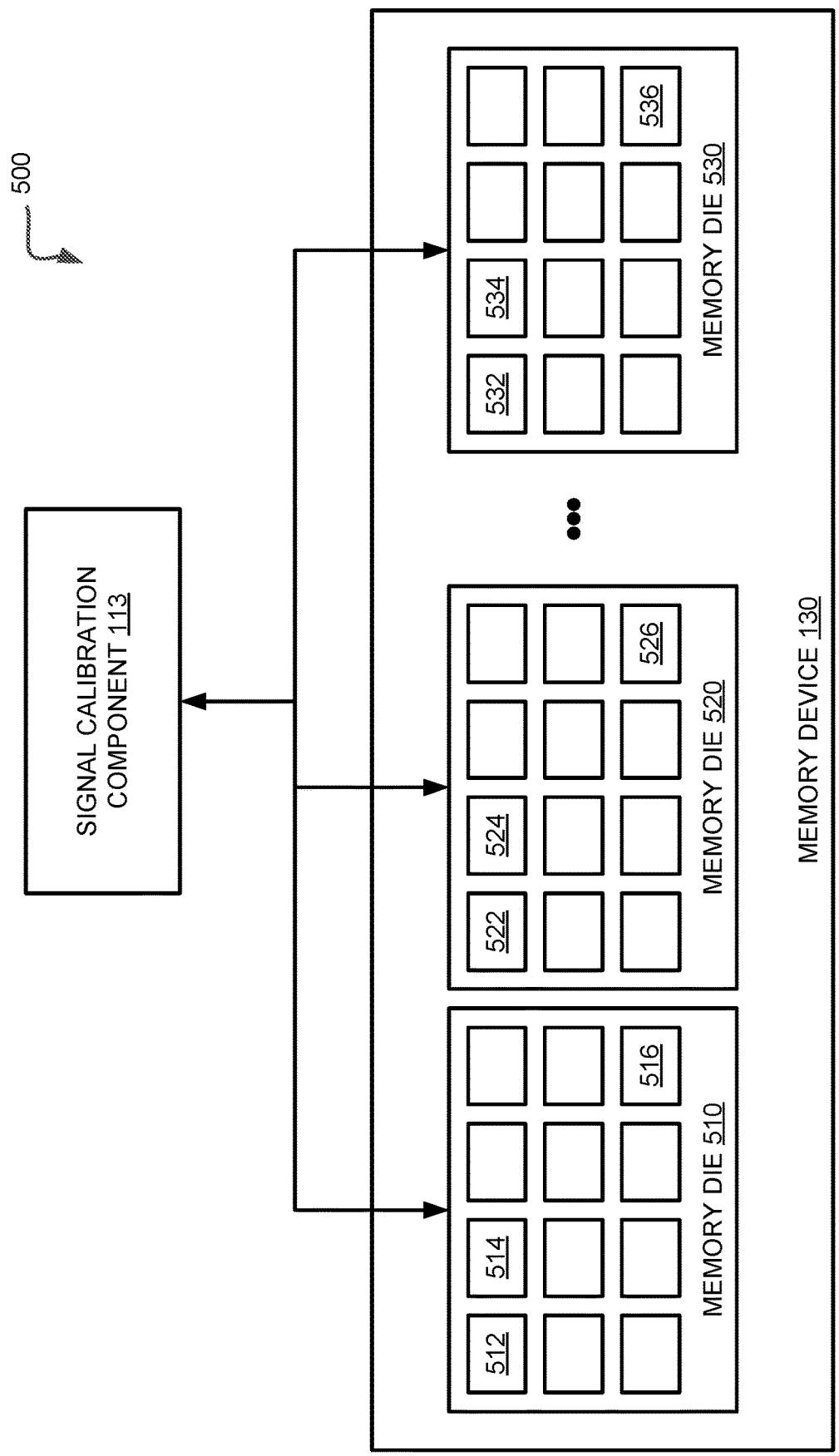
FIG. 5 is a block diagram illustrating operation of a signal calibration component performing read refresh via signal calibration for a memory device in accordance with some embodiments of the present disclosure.

FIG. 5 is a block diagram illustrating operation 500 of a signal calibration component 113 performing read refresh via signal calibration for a memory device 130 in accordance with some embodiments of the present disclosure. In one embodiment, memory device 130 can include multiple memory die, such as memory die 510, 520, 530, each including a number of memory segments. Depending on the embodiment, the identified region 232 of memory device 130 can also span multiple memory die. In different embodiments, signal calibration component 113 can use different algorithms to ensure that each of the memory components across the multiple memory die 510, 520, 530 are read by signal calibration read operations during the first time interval.

In one embodiment, signal calibration component 113 sequentially reads each segment of a given memory die 510 until all segments in the memory die 510 have been read. For example, signal calibration component 113 can sequentially read segments 512, 514, and so on, ending with segment 516. Then, signal calibration component 113 can switch to the next memory die, such as memory die 520, sequentially reading segments 522, 524, and so on, ending with segment 526. Signal calibration component 113 can repeat this process in the same fashion for all memory dies, ending with memory die 530 and sequentially reading segments 532, 534, and so on, up to segment 536. Once all of the segments on all of the memory die of memory device 130 (or in region 232) have been read, signal calibration component 113 can return to the first memory die 510 and continue the process.

In another embodiment, signal calibration component 113 reads a first segment of each memory die, then reads a second segment of each memory die, then reads a third segment of each memory die, and so on. For example, signal calibration component 113 can read segment 512 of memory die 510, then read segment 522 of memory die 520, and then read segment 532 of memory die 530. After reading the first segment on each of memory die 510, 520, 530, signal calibration component 113 can return to the first memory die 510 and begin reading the second segment of each memory die. For example, signal calibration component 113 can read segment 514 of memory die 510, then read segment 524 of memory die 520, and then read segment 534 of memory die 530. Signal calibration component 113 can repeat this process in the same fashion, ending by reading segment 516 of memory die 510, segment 526 of memory die 520, and segment 536 of memory die 530. Once all of the segments on all of the memory die of memory device 130 (or in region 232) have been read, signal calibration component 113 can return to the first memory die 510 and continue the process.

Depending on the embodiment, and on the specific media type used for memory device 130, other algorithms are possible. For example, each memory die 510, 520, 530 can have other meaningful mid-level structures (e.g., a layer, plane, etc.) between the individual memory unit and the memory die. Thus, other multiple-fold loops can be formed to ensure that each segment is read. Furthermore, the order in which these nested loops are followed can be arbitrary, depending on the hardware implementation details.

Figure 6:
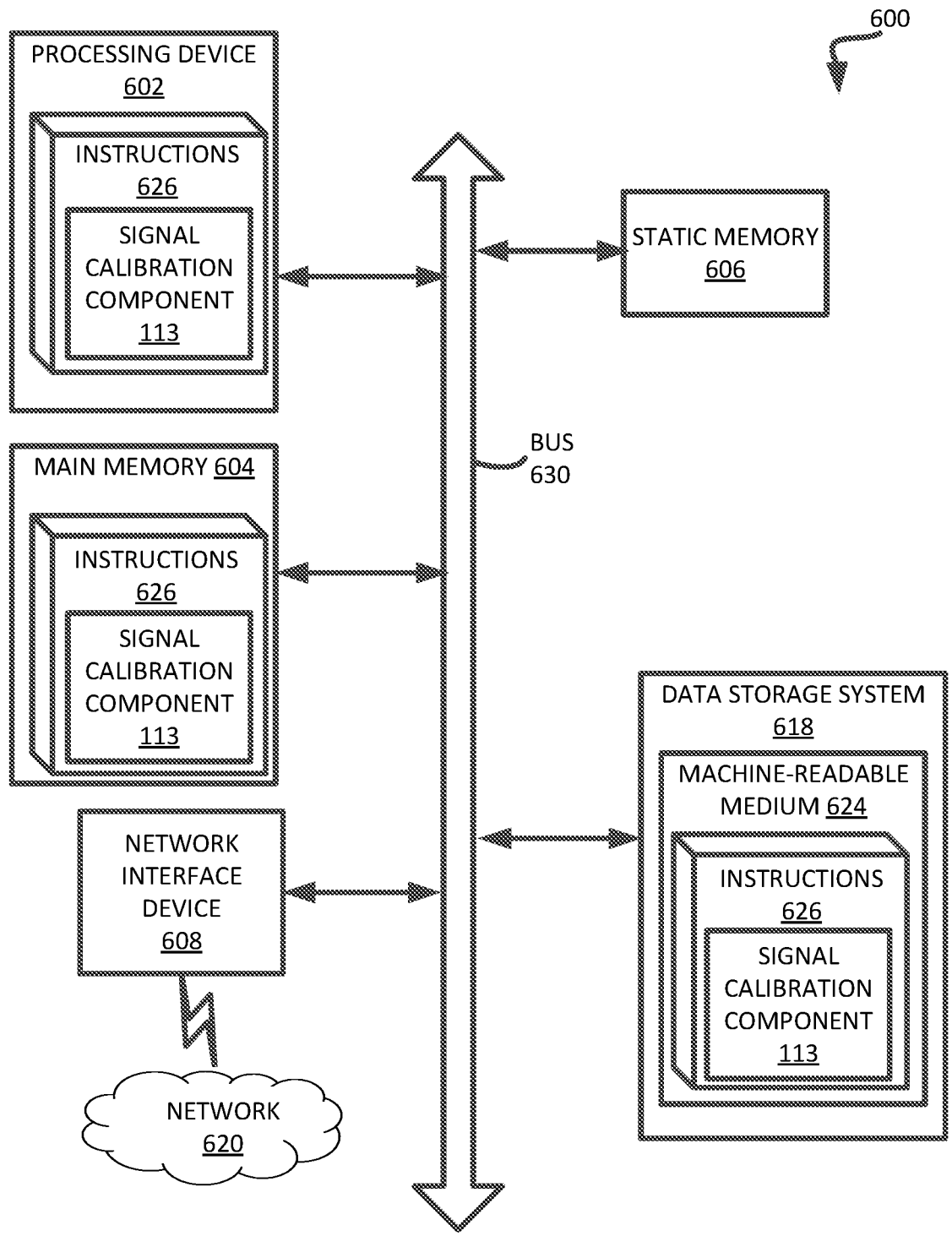
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to signal calibration component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to signal calibration component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device;
   a processing device, operatively coupled with the memory device, to perform operations comprising:
   receiving, as a result of a sequential series of read operations performed on a plurality of segments in a first region of the memory device to read data from each of the plurality of segments at least once during a first time interval, a plurality of data signals; and
   performing one or more signal calibration operations on the plurality of data signals read from the plurality of segments by the sequential series of read operations during the first time interval, wherein performing the one or more signal calibration operations comprises comparing offsets between transitions of the plurality of data signals and a reference clock signal and, if the offsets are not within an allowable deviation from an expected value, adjusting the offsets to synchronize the plurality of data signals.

2. The system of claim 1, wherein the first region comprises one or more of:
   a mapped area having one or more segments currently storing host data;
   an unmapped area having one or more segments not currently storing host data but eligible to store host data;
   a reserved area having one or more segments available to replace defective segments on the memory device; or
   a retired area having one or more defective segments that previously stored host data.

3. The system of claim 1, wherein the processing device is to perform operations further comprising:
   initiating a subsequent threshold period responsive to a first expiration of at least one read operation of the sequential series of read operations; and
   initiating a subsequent read operation responsive to a second expiration of the subsequent threshold time period.

4. The system of claim 1, wherein the memory device comprises a plurality of memory dies and wherein the first region of the memory device spans the plurality of memory dies.

5. The system of claim 4, wherein the processing device is to perform operations further comprising:
   initiating the sequential series of read operations on the plurality of segment in the first region of the memory device.

6. The system of claim 5, wherein initiating the sequential series of read operations on the plurality of segments in the first region of the memory device comprises:
   sequentially reading each segment on a first memory die of the plurality of memory dies; and
   sequentially reading each segment on a second memory die of the plurality of memory dies after sequentially reading each segment on the first memory die.

7. The system of claim 5, wherein initiating the sequential series of read operations on the plurality of segments in the first region of the memory device comprises:
   reading a first segment on each of the plurality of memory dies; and
   reading a second segment on each of the plurality of memory dies after reading the first segment on each of the plurality of memory dies.

8. The system of claim 1, wherein the processing device to perform operations further comprising:
   determining a change to the first region of the memory device, the change forming a second region of the memory device;
   initiating second read operations on each of a plurality of segments in the second region of the memory device;
   receiving, as a result of at least one second read operation, at least one second data signal from a corresponding second one of the plurality of segments in the second region of the memory device; and
   performing a second signal calibration operation using the at least one second data signal to synchronize the at least one second data signal with the reference clock signal used by the processing device.

9. The system of claim 1, wherein the processing device to perform operations further comprising:
   scheduling a read refresh operation on a subset of the plurality of segments in the first region of the memory device storing host data at a first frequency, wherein the first frequency is based on a length of the first time interval.

10. A method comprising:
    receiving, as a result of a sequential series of read operations performed on a plurality of segments in a first region of a memory device to read data from each of the plurality of segments at least once during a first time interval, a plurality of data signals; and
    performing one or more signal calibration operations on the plurality of data signals read from the plurality of segments by the sequential series of read operations during the first time interval, wherein performing the one or more signal calibration operations comprises comparing offsets between transitions of the plurality of data signals and a reference clock signal and, if the offsets are not within an allowable deviation from an expected value, adjusting the offsets to synchronize the plurality of data signals.

11. The method of claim 10, wherein the first region comprises one or more of:
    a mapped area having one or more segments currently storing host data;
    an unmapped area having one or more segments not currently storing host data but eligible to store host data;
    a reserved area having one or more segments available to replace defective segments on the memory device; or
    a retired area having one or more defective segments that previously stored host data.

12. The method of claim 10, further comprising:
    initiating a subsequent threshold period responsive to a first expiration of at least one read operation of the sequential series of read operations; and
    initiating a subsequent read operation responsive to a second expiration of the subsequent threshold time period.

13. The method of claim 10, wherein the memory device comprises a plurality of memory dies and wherein the first region of the memory device spans the plurality of memory dies.

14. The method of claim 13, further comprising:
    initiating the sequential series of read operations on the plurality of segment in the first region of the memory device.

15. The method of claim 14, wherein initiating the sequential series of read operations on the plurality of segments in the first region of the memory device comprises:
    sequentially reading each segment on a first memory die of the plurality of memory dies; and
    sequentially reading each segment on a second memory die of the plurality of memory dies after sequentially reading each segment on the first memory die.

16. The method of claim 14, wherein initiating the sequential series of read operations on the plurality of segments in the first region of the memory device comprises:
    reading a first segment on each of the plurality of memory dies; and
    reading a second segment on each of the plurality of memory dies after reading the first segment on each of the plurality of memory dies.

17. The method of claim 10, further comprising:
    determining a change to the first region of the memory device, the change forming a second region of the memory device;
    initiating second read operations on each of a plurality of segments in the second region of the memory device;
    receiving, as a result of at least one second read operation, at least one second data signal from a corresponding second one of the plurality of segments in the second region of the memory device; and
    performing a second signal calibration operation using the at least one second data signal to synchronize the at least one second data signal with the reference clock signal.

18. The method of claim 10, further comprising:
    scheduling a read refresh operation on a subset of the plurality of segments in the first region of the memory device storing host data at a first frequency, wherein the first frequency is based on a length of the first time interval.

19. A non-transitory computer-readable storage medium comprising instructions that, when executed by a processing device, cause the processing device to:
    receiving, as a result of a sequential series of read operations performed on a plurality of segments in a first region of a memory device to read data from each of the plurality of segments at least once during a first time interval, a plurality of data signals; and
    performing one or more signal calibration operations on the plurality of data signals read from the plurality of segments by the sequential series of read operations during the first time interval, wherein performing the one or more signal calibration operations comprises comparing offsets between transitions of the plurality of data signals and a reference clock signal and, if the offsets are not within an allowable deviation from an expected value, adjusting the offsets to synchronize the plurality of data signals.

20. The non-transitory computer-readable storage medium of claim 19, wherein the first region comprises one or more of:
    a mapped area having one or more segments currently storing host data;

an unmapped area having one or more segments not currently storing host data but eligible to store host data;

a reserved area having one or more segments available to replace defective segments on the memory device; or a retired area having one or more defective segments that previously stored host data.

* * * * *